United States Patent [19]

Higashikawa et al.

[11] Patent Number: 4,473,437
[45] Date of Patent: Sep. 25, 1984

[54] DRY ETCHING METHOD FOR ORGANIC MATERIAL LAYERS

[75] Inventors: Iwao Higashikawa; Tsunetoshi Arikado, both of Tokyo, Japan

[73] Assignee: Tokyo Shibaura Denki Kabushiki Kaisha, Kanagawa, Japan

[21] Appl. No.: 552,254

[22] Filed: Nov. 16, 1983

[30] Foreign Application Priority Data

Mar. 8, 1983 [JP] Japan .................................. 58-37938

[51] Int. Cl.[3] ........................ B44C 1/22; C03C 15/00; C03C 25/06; B29C 17/08
[52] U.S. Cl. .................................... 156/643; 156/646; 156/655; 156/659.1; 156/668; 156/345; 204/192 E; 204/298; 252/79.1
[58] Field of Search ............ 156/643, 646, 655, 659.1, 156/668, 345; 204/164, 192 E, 298; 252/79.1; 427/38, 39, 43.1

[56] References Cited

U.S. PATENT DOCUMENTS 4,374,699 2/1983 Sanders et al. ..................... 156/643
4,381,967 5/1983 Sanders et al. ..................... 156/643

OTHER PUBLICATIONS

M. Hatzakis, "Multilayer Resist Systems for Lithography", *Solid State Technology*, Aug. 1981, pp. 74–80.
J. Moran et al., "High Resolution, Steep Profile, Resist Patterns", The Bell System Technical Journal, vol. 58, No. 5, May–Jun. 1979, pp. 1026–1036.

*Primary Examiner*—William A. Powell
*Attorney, Agent, or Firm*—Banner, Birch, McKie & Beckett

[57] ABSTRACT

A dry etching method for organic material layers is disclosed which utilizes a parallel plate electrode type plasma etching apparatus. An etching gas containing nitrogen as its primary constituent is introduced into the apparatus, and then the organic material layers are anisotropically etched by applying a high frequency electric power to the electrodes to produce a plasma.

6 Claims, 8 Drawing Figures

DRY ETCHING METHOD FOR ORGANIC MATERIAL LAYERS

BACKGROUND OF THE INVENTION

This invention relates to an improved dry etching method, especially a dry etching method for etching organic material layers anisotropically.

DESCRIPTION OF THE PRIOR ART

For the purpose of fabricating integrated circuit devices of very high density, a microprocessing technique of high precision is required. For example, various types of multi-layered resist processes, which are disclosed in "Solid State Technology," August 1981, pages 74-80, by M. Hatzakis, can be used to overcome the difficulty of forming a high resolution resist pattern on an etching workpiece with an uneven surface. The principle of some of the processes is illustrated in FIG. 1. In FIG. 1(a), layer 1 of aluminum or other suitable material to be etched, has an uneven surface. Organic material layer 2, for example a resist layer, is applied over layer 1 in solution form and solidified by heating to form a level layer. Next, mask material layer 3 having an etching rate different than organic material layer 2 is formed on layer 2 and covered by resist layer 4. Resist layer 4 is substantially flat so that a high resolution etching pattern can be obtained by a conventional photo engraving process. Using the pattern of resist layer 4 as an etching mask, mask material layer 3 is patterned as shown in FIG. 1(a). Subsequently, using mask material layer 3 as an etching mask, organic material layer 2 is etched off anisotropically and resist layer 4 is removed as shown in FIG. 1(b). Moreover, using patterned organic material layer 2 as an etching mask, aluminum layer 1 is etched precisely.

A known drying etching method for organic material layer 2, which levels etching layer 1, uses an $O_2$ gas as disclosed in "Proceedings of 4th Dry Process Symposium," Tokyo 1982, by T. Arikado. According to this dry etching method, a workpiece with an organic material layer is placed on a cathode electrode of a parallel plate electrode type plasma etching apparatus. By properly setting the gas pressure in the etching chamber where the workpiece is placed and the electric power of a high frequency electric power source connected across the cathode and anode, a plasma is produced which then etches the organic material layer.

However, in the above organic material dry etching method, it is difficult to etch the organic material layer accurately because of side-etching of the organic material layer, recession of the mask material thereon, etc. When $O_2$ gas is used in this dry etching process, the density of oxygen radicals $O^*$ is high under a high gas pressure condition in the etching chamber, which produces side-etching of organic material layer 2 as shown in FIG. 2(a). On the other hand, under a low gas pressure condition, increased ion sputtering occurs due to an increase in the cathode drop voltage of the parallel plate electrode type dry etching apparatus. Though side-etching does not occur under this low gas pressure condition, a pattern transfer error does occur because of recession of mask material layer 3 as shown in FIG. 2(b). Side-etching of organic material layer 2 and recession of mask material layer 3 are undesirable because they diminish processing accuracy and result in serious defects in the microprocessing technique.

SUMMARY OF THE INVENTION

It is an object of the present invention to provide a dry etching method for organic material layers which can etch the same substantially anisotropically to improve processing accuracy.

The above and other objects are achieved according to the invention by utilizing an etching gas containing nitrogen.

In the present invention, it was recognized that the problems of side-etching of the organic material layer and recession of the mask material layer in dry etching of an organic material layer occurred because of the use of an $O_2$ gas. Oxygen ions accelerated by the cathode drop voltage in a parallel plate electrode type dry etching apparatus bombard the surface of an organic material layer to decompose the organic material into carbon or hydrocarbon fragments containing one to three carbon atoms such as C, $CH_2$, $C_2H_5$, etc. Furthermore, the fragments produced through the decomposition are oxidized by oxygen radicals $O^*$ in the vicinity of the surface of the organic material layer to produce $H_2O$, CO, $CO_2$, etc. At the same time, a chemical action occurs between $O^*$ and unbombarded portions of the organic material layer so that side-etching occurs. However, the inventors of the present invention believed that anisotropic etching can be attained without side-etching, even under a high gas pressure with rich radicals, by applying such radicals as react with the aforementioned carbon or hydrocarbon fragments but not with the unbombarded portions of the organic material layer. In addition, since the fragments are radicals with one unpaired electron, carbons with two unpaired electrons, ions, etc. which are active themselves, the present inventors further believed that these fragments would react even with rather inert species.

Accordingly, in the present invention, nitrogen has been found to be an ideal dry etching gas for organic layer materials because it produces an anisotropic etching. A nitrogen radical $N^*$ has an electron disposition of $2S^22P^3$ in an outer shell in ground state and has a maximum number of unpaired electrons in a valence orbital nutshell. Therefore, electron repulsion does not occur in the $N^*$, so that in comparison with an oxygen radical $O^*$, it is stable and its reactivity is remarkably small to unbombarded organic materials. It has been discovered in the present invention that nitrogen gas etching causes neither side-etching under a high gas pressure nor recession of a mask material layer. Moreover it was also discovered that carbon or hydrocarbon fragments, i.e., C, $CH_2$, $C_2H_5$, etc., which are produced through decomposition of organic material layers by ion bombardment, react well with $N^*$ to produce CN, HCN, etc. Also, it has been discovered that the etching speed of nitrogen is sufficient.

On the basis of the above discoveries, the present invention provides a dry etching method for organic material layers comprising the steps of placing a workpiece having an organic material layer and an etching mask pattern on a cathode electrode facing an anode electrode in an etching chamber, and then introducing a gas containing nitrogen as the primary constituent into the etching chamber while simultaneously applying a high frequency electrical voltage between the electrodes to produce a plasma to thereby selectively and anisotropically etch the organic material layer.

DETAILED DESCRIPTION OF THE PREFERRED EMBODIMENTS

Figure 1:
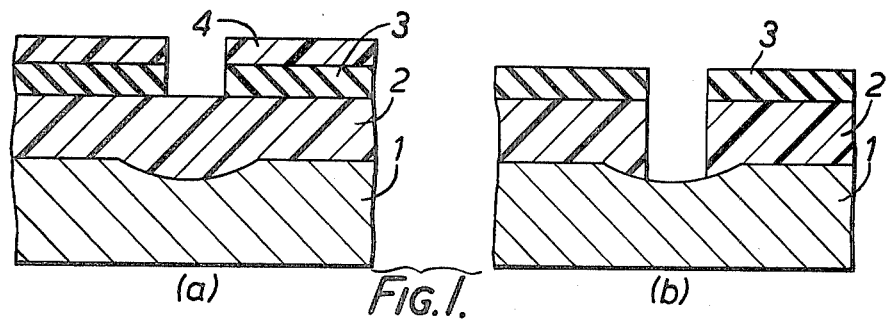
FIGS. 1(a) and 1(b) show sectional views of a workpiece in two steps of a conventional multi-layered resist process.
Figure 2:
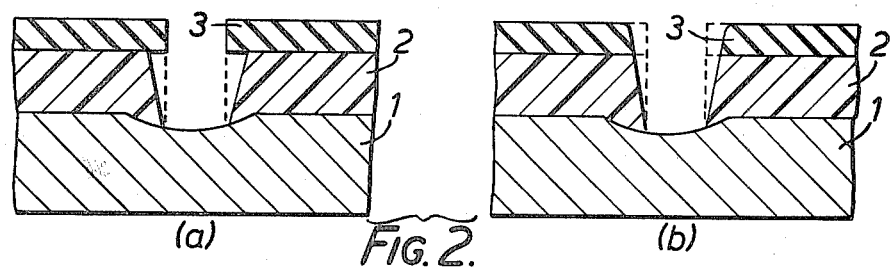
FIGS. 2(a) and 2(b) show sectional views of a workpiece which illustrate problems of a conventional dry etching method using oxygen gas.
Figure 3:
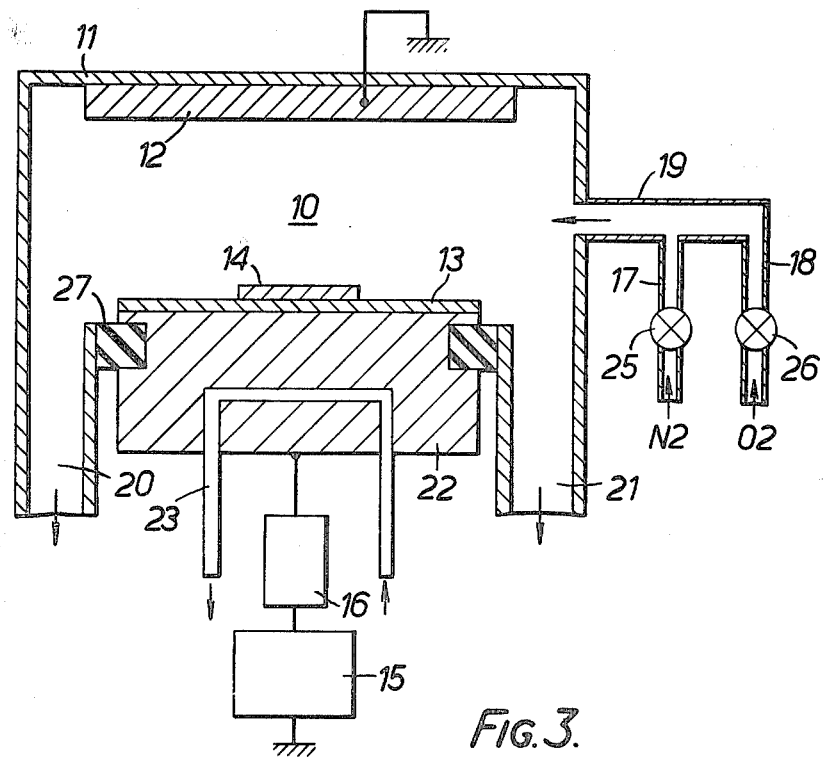
FIG. 3 shows a schematic view of a parallel plate electrode type dry etching apparatus utilized in the invention.

FIG. 3 is a schematic view showing a parallel plate electrode type dry etching apparatus utilized in the invention. In FIG. 3, a pair of electrodes 12, 13 face each other in etching chamber 10 of housing 11. Upper electrode 12 constitutes an anode, which is grounded. Lower electrode 13 constitutes a cathode, to which high frequency electric power is supplied from high frequency electric source 15 via matching circuit 16. The lower electrode is fixed on support member 22, and thereon is placed workpiece 14 having an organic material layer. An insulator film may be placed between workpiece 14 and lower electrode 13. These electrodes 12, 13 are electrically isolated from each other by insulator 27. Cooling pipe 23 runs through support member 22. An etching gas is introduced into etching chamber 11 through gas supply pipe 19 connected to pipes 17, 18 which are provided with valves 25, 26. The etching gas is exhausted from etching chamber 11 through gas exhaust pipes 20, 21.

Figure 4:
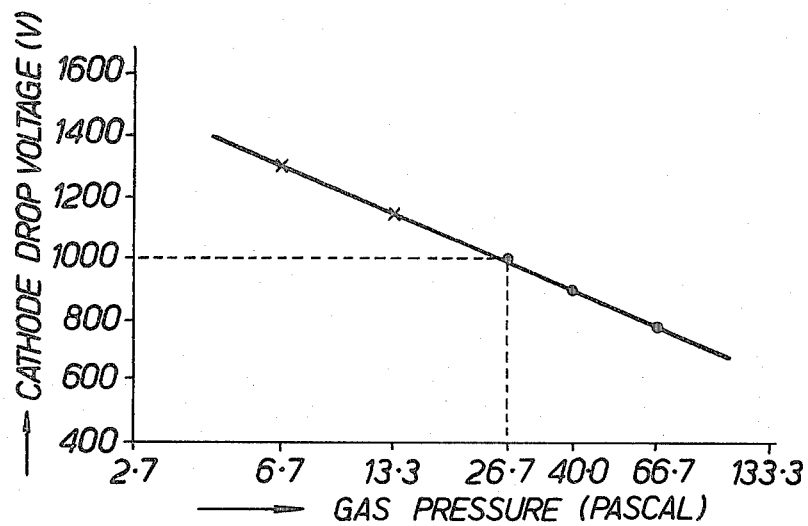
FIG. 4 is a graph illustrating the relationship among the gas pressure, the cathode drop voltage and the recession of a mask material layer when a nitrogen gas is used in the apparatus of FIG. 3.

FIG. 4 shows the relationship among the gas pressure, the cathode drop voltage and the recession of a mask material layer formed on a positive type resist layer of the novolac resin group having the following chemical formula:

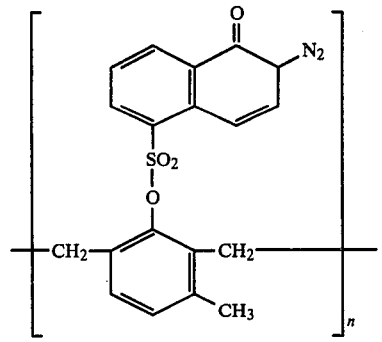

In the case of FIG. 4, the workpiece was etched by introducing a $N_2$ gas into the dry etching apparatus shown in FIG. 3. A high frequency electric power of 500 W was applied between the pair of electrodes 12, 13. In FIG. 4, the mark (.) represents no recession of the mask material layer, and the mark (x) represents the occurrence of recession. As shown in FIG. 4, the cathode drop voltage decreases in accordance with an increase of the gas pressure and recession of the mask material layer does not occur at a cathode drop voltage less than 1000 V. Thus, high accuracy etching can be achieved if the cathode drop voltage is kept at or below 1000 V, since recession of the mask material layer is prevented.

Figure 5:
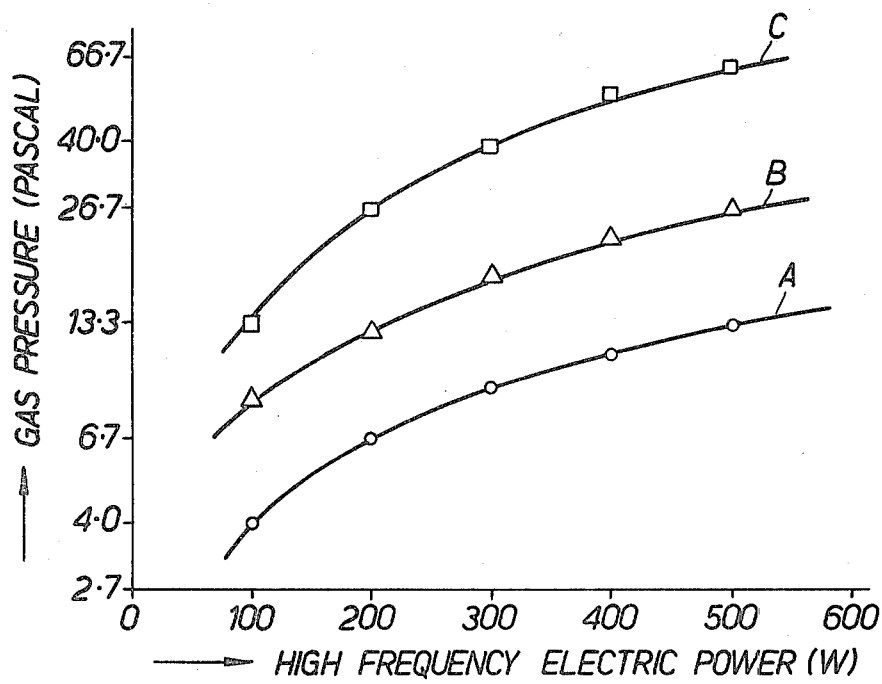
FIG. 5 shows the characteristic curves denoting the relationship between the high frequency electric power and the gas pressure when a nitrogen gas is used in the apparatus of FIG. 3.

FIG. 5 shows characteristic curves denoting the relationship between the high frequency electric power and the gas pressure for different cathode drop voltages when a $N_2$ gas was introduced into the apparatus of FIG. 3. In FIG. 5, the curves A, B and C correspond to cathode drop voltages of 1100 V, 1000 V and 800 V, respectively. From FIGS. 4 and 5, it is understood that recession of the mask material layer can be prevented by setting the high frequency electric power and the gas pressure in the area above the curve B of FIG. 5 in order to maintain the cathode drop voltage at or below 1000 V. Under this condition, side-etching also does not occur.

Two illustrative embodiments of the present invention will now be described.

EXAMPLE 1

FIGS. 6(a)–6(f) are sectional views of a workpiece in each step of an embodiment of the invention applied to the process of patterning interconnections of an MOS transistor.

Figure 6:
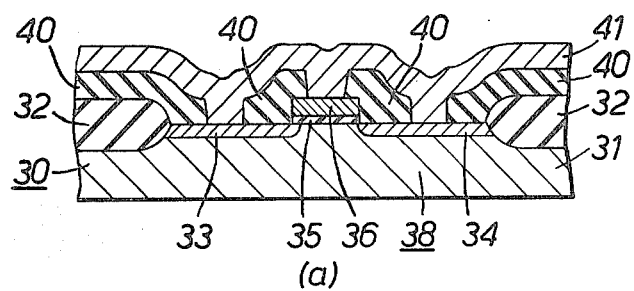
FIGS. 6(a)–6(f) show sectional views of a workpiece in each step of an embodiment of the invention applied to the process of patterning interconnections of an MOS transistor.
Figure 6:
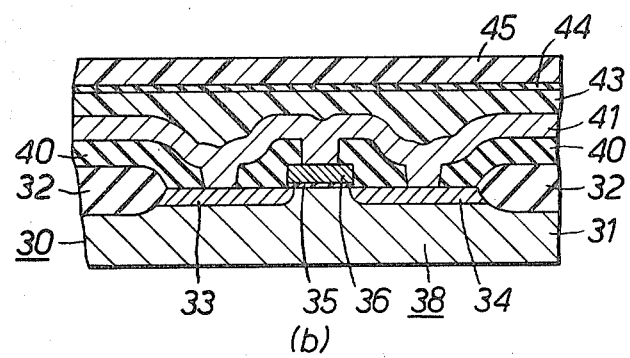
Figure 6:
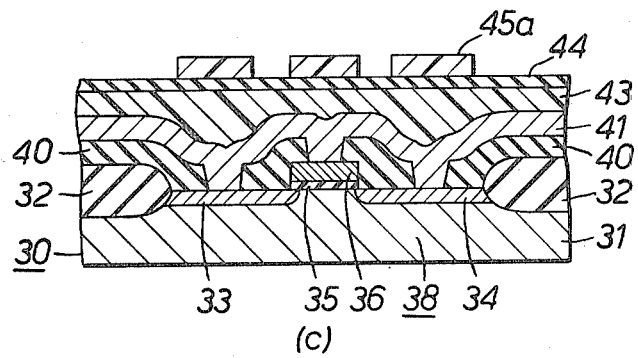
Figure 6:
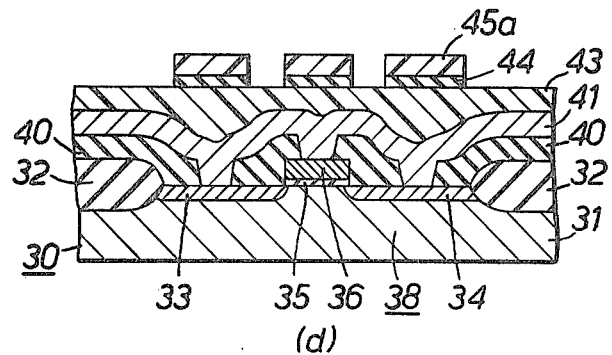
Figure 6:
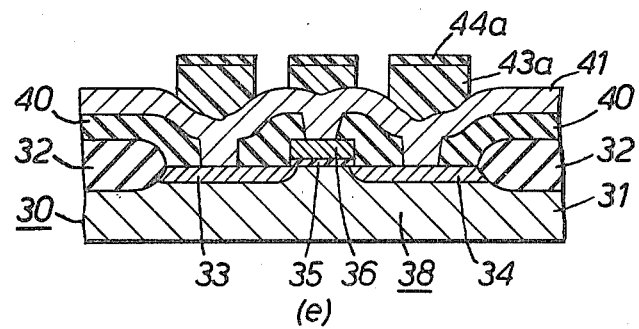
Figure 6:
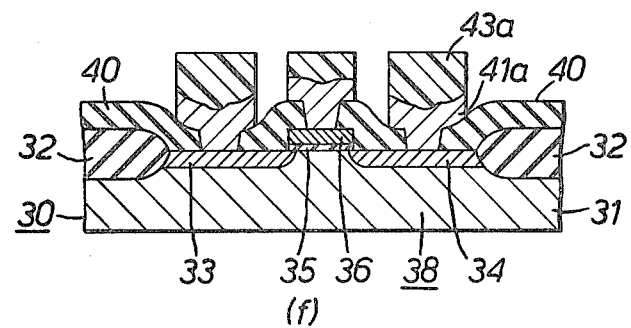

FIG. 6(a), a N-channel MOS transistor is formed on workpiece 30 in a conventional manner. This transistor is provided with source 33, drain 34, gate oxide film 35 and gate electrode 36 surrounded by field oxide film 32. Workpiece 30 further includes insulator film 40 having contact holes and aluminum-silicon alloy film 41 having an uneven surface. As described below, this alloy film 41 is selectively etched by a multi-layered resist process which includes the dry etching method according to the invention.

In the dry etching method, a positive type resist solution of the novolac resin group first is applied over the surface of aluminum-silicon alloy film 41. The novolac resin group has the following formula:

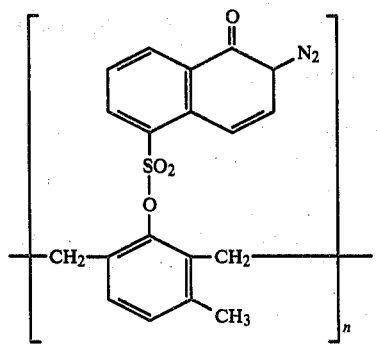
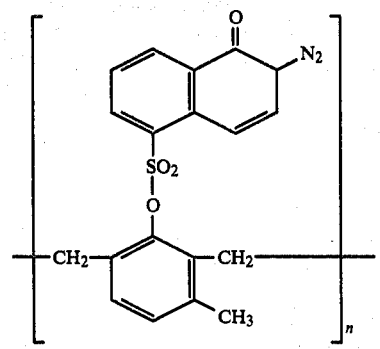

The resist solution over alloy film 41 has a thickness of approximately 2 μm on the average. Subsequently, the resist solution is solidified by heating so that the surface of alloy film 41 is leveled and resist layer 43 is formed as shown in FIG. 6(b). SiO₂ film 44 is formed on resist layer 43. Furthermore, over the surface of SiO₂ film 44, a positive type resist solution of the novolac resin group is applied and solidified by heating, so that resist layer 45 of 1 μm thickness if formed (FIG. 6(b)). Next, as shown in FIG. 6(c), resist pattern 45a is formed by a conventional photolithography process including an electron beam exposure technique and a resist development technique by KOH. The resolution rate of resist pattern 45a is remarkably high because of the flatness of resist layer 45.

Subsequently SiO₂ film 44 is etched using resist pattern 45a as a mask by an anisotropic dry etching method utilizing a CF₄ gas (FIG. 6(d)). Thereafter, resist layer 43 is anisotropically etched using a N₂ gas by placing workpiece 30 on a quartz plate on cathode electrode 13 as shown in FIG. 3. A N₂ gas is supplied to etching chamber 10 by opening valve 25. Results show that, when the gas pressure in etching chamber 10 was 0.3 Torr and the high frequency electric power was 500 W at 13.56 MHz, an etching speed of 3000 Angstrom/minute was obtained. Thus, in an etching time of 8 minutes, resist pattern 43a was formed as shown in FIG. 6(e). On observing the sectional shape and the surface configuration of the workpiece by a scan microscope, it was found that resist layer 43 was etched according to the shape of SiO₂ film pattern 44a with fidelity, and with very minimal side-etching of layer 43 and recession of pattern 44a.

Next, SiO₂ film pattern 44a is removed as shown in FIG. 6(f), and aluminum-silicon alloy film 41 is anisotropically etched using resist pattern 43a as a mask and using a mixture of CCl₄ and Cl₂ as an etching gas. Thus, interconnection pattern 41a is completed as shown in FIG. 6(f).

EXAMPLE 2

Figure 7:
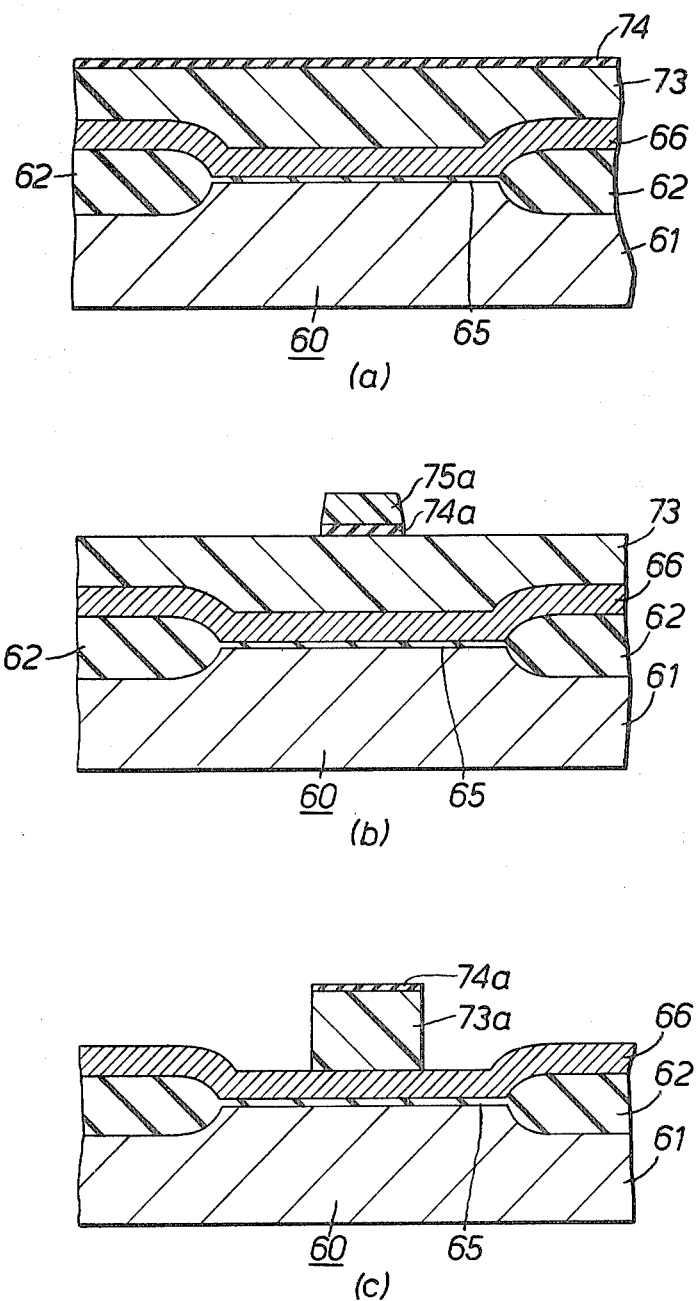
FIGS. 7(a)–7(c) show sectional views of a workpiece in each step of another embodiment of the invention applied to the process of forming a gate electrode of an MOS transistor.

FIGS. 7(a)-7(c) show sectional views of a workpiece in each step of another embodiment of the invention applied to the process of patterning a gate electrode.

As first shown in FIG. 7(a), workpiece 60 includes field oxide film 62 and gate oxide film 65 formed on silicon substrate 61. Polysilicon film 66 containing N-type impurities is deposited over the entire surface. Then, a resist layer 73 of the novolac resin group having an average thickness of 2 μm and SiO₂ film 74 are formed over the entire surface. The novolac resin group has the following chemical formula:

Thereafter, resist pattern 75a of a 1 μm thickness is formed by a conventional photolithography technique as shown in FIG. 7(b). Using resist pattern 75a as an etching mask, SiO₂ film 74 is anisotropically etched by a CH₄ gas to form a SiO₂ film pattern 74a.

Next, the workpiece shown in FIG. 7(b) is placed directly on cathode 13 of the apparatus in FIG. 3. An etching gas primarily containing nitrogen then is introduced into the apparatus. This etching gas may be a mixture of N₂ and O₂ at a mixture rate of N₂ to the total under 30 mol %. The mixture can be controlled by regulating the opening of valves 25 and 26. With a gas pressure of 0.3 Torr and a high frequency electric power of 500 W at 13.56 MHz, in an etching time of 5 minutes, resist pattern 73a is formed as shown in FIG. 7(c) by an anisotropic etching of resist layer 73. At that time, any side-etching of resist layer 73 and any recession of SiO₂ film pattern 74a were scarcely visible. Subsequently, polysilicon film 66 is etched using a mixture of Cl₂ and H₂ and using resist pattern 73a as an etching mask in order to form a gate electrode.

The above invention can be applied in various forms other than the above examples. Various organic material layers, for example a polystyrene layer of a low melting point or a polyimide layer of thermohardening, may be used instead of resist layers 43, 73. Furthermore, mask material layers 44 and 74a may be formed of Si, SiN, MoSi₂, etc. as well as SiO₂, all of which show a high etching selectivity rate to the above organic material layers. The etching gas containing nitrogen may be a gas containing not only N₂ but also such additives as O₂, H₂SO₃, CO, CO₂, etc. Preferably, the amount of the additives should be at or below 30 mol % of the total to accomplish an efficient etching by nitrogen. Furthermore, for the etching gas, at least one selected from the group of N₂, N₂O, NO, NO₂ may be used. In any case, the amount of oxygen should be set at 30 mol % of the total or less for the purpose of preventing side-etching during the condition of attainment of anisotropic etching.

We claim:

1. In a parallel plate electrode type dry etching apparatus for etching a workpiece, said apparatus including an etching chamber containing an anode and a cathode facing said anode, a dry etching method for etching an organic material layer of said workpiece comprising the steps of:

mounting said workpiece on said cathode facing said anode in said etching chamber, said workpiece having an etching mask layer formed on an organic material layer;

introducing a gas containing nitrogen as its primary constituent into said etching chamber; and applying a high frequency electric power between said anode and said cathode while introducing said gas to produce a plasma to thereby selectively etch the organic material layer.

2. A dry etching method for etching an organic material layer according to claim 1 wherein the high frequency electric power and the gas pressure in said etching chamber are set to keep the cathode drop voltage between said anode and said cathode at or below 1000 volts.

3. A dry etching method for etching an organic material layer according to claim 1 wherein the gas containing nitrogen contains nitrogen and an additive at or below 30 mol % of the total.

4. A dry etching method for etching an organic material layer according to claim 1 wherein said gas contains at least one selected from the group of $N_2$, $N_2O$, $NO$ and $NO_2$.

5. A dry etching method for etching an organic material layer according to claim 1 wherein said gas further contains at least one additive selected from the group of $H_2$, $SO_2$, $CO$ and $CO_2$.

6. A dry etching method for etching an organic material layer according to claim 1 wherein said gas consists of a mixture of $N_2$ and $O_2$, the amount of $O_2$ being equal to or less than 30 mol %.

* * * * *